US006519733B1

United States Patent
Har et al.

(10) Patent No.: US 6,519,733 B1
(45) Date of Patent: Feb. 11, 2003

(54) METHOD AND APPARATUS FOR HIGH INTEGRITY HARDWARE MEMORY COMPRESSION

(75) Inventors: David Har, Briarcliff, NY (US); Kwok-Ken Mak, Wappingers Falls, NY (US); Charles O. Schulz, Ridgefield, CT (US); T. Basil Smith, III, Wilton, CT (US); R. Brett Tremaine, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/511,849

(22) Filed: Feb. 23, 2000

(51) Int. Cl.[7] .............................................. H03M 13/00
(52) U.S. Cl. ....................................................... 714/758
(58) Field of Search ................................ 714/746, 752, 714/758, 763, 773

(56) References Cited

U.S. PATENT DOCUMENTS

| | | | |
|---|---|---|---|
| 5,093,831 A | * 3/1992 | Serizawa et al. | 714/771 |
| 5,200,962 A | * 4/1993 | Kao et al. | 714/774 |
| 5,608,396 A | 3/1997 | Cheng et al. | 341/50 |
| 5,812,817 A | 9/1998 | Hovis et al. | 711/173 |
| 6,009,547 A | * 12/1999 | Jaquette et al. | 714/758 |

* cited by examiner

*Primary Examiner*—Albert Decady
*Assistant Examiner*—Shelly A Chase
(74) *Attorney, Agent, or Firm*—Scully, Scott, Murphy & Presser; Derek S. Jennings, Esq.

(57) ABSTRACT

In a processing system having a main memory, wherein information is stored in a compressed format for the purpose of gaining additional storage through compression efficiencies, a method and apparatus for providing compressed data integrity verification to insure detection of nearly any data corruption resulting from an anomaly anywhere in the logical processing or storage of compressed information. A cyclic redundancy code (CRC) is computed over a compressed data block as the data enters the compressor hardware, and the CRC is appended to the compressor output block before it is stored into the main memory. Subsequent read access results in comparing the CRC against a recomputation of the CRC as the block is uncompressed from the main memory. Any CRC miscompare implies an uncorrectable data error condition that may be used to interrupt the system operation.

17 Claims, 4 Drawing Sheets

METHOD AND APPARATUS FOR HIGH INTEGRITY HARDWARE MEMORY COMPRESSION

BACKGROUND OF THE INVENTION

1. Field of the Invention

This invention relates generally to the field of compressed memory architecture in computer systems, and more specifically, to an improved method and apparatus for operating a main memory compressor.

2. Discussion of the Prior Art

Computer systems generally consist of one or more processors that execute program instructions stored within a mass storage medium. This mass storage medium is most often constructed of the lowest cost per bit, yet slowest storage technology, typically magnetic or optical media. To increase the system performance, a higher speed, yet smaller and more costly memory, known as the main memory, is first loaded with information from the mass storage for more efficient direct access by the processors. Even greater performance is achieved when a higher speed, yet smaller and more costly memory, known as a cache memory, is placed between the processor and main memory to provide temporary storage of recent/and or frequently referenced information. As the difference between processor speed and access time of the final storage increases, more levels of cache memory are provided, each level backing the previous level to form a storage hierarchy. Each level of the cache is managed to maintain the information most useful to the processor. Often more than one cache memory will be employed at the same hierarchy level, for example when an independent cache is employed for each processor. Caches have evolved into quite varied and sophisticated structures, but always address the tradeoff between speed and both cost and complexity, while functioning to make the most useful information available to the processor as efficiently as possible.

Recently, cost reduced computer system architectures have been developed that more than double the effective size of the main memory by employing high speed compression/decompression hardware based on common compression algorithms, in the path of information flow to and from the main memory. Processor access to main memory within these systems is performed indirectly through the compressor and decompressor apparatuses, both of which add significantly to the processor access latency costs. Large high speed cache memories are implemented between the processor and the compressor and decompressor hardware to reduce the frequency of processor references to the compressed memory, mitigating the effects the high compression/decompression latency. These caches are partitioned into cache lines, equal in size to the fixed information block size required by the compressor and decompressor.

Referring to FIG. 1, a block diagram of a prior art computer system 100 is shown. The computer system includes one or more processors 101 connected to a common shared memory controller 102 that provides access to a system main memory 103. The shared memory controller contains a compressor 104 for compressing fixed size information blocks into as small a unit as possible for ultimate storage into the main memory, a decompressor 105 for reversing the compression operation after the stored information is later retrieved from the main memory, and write queue 113 for queuing main memory store request information block(s) destined for the compressor. The processor data bus 108 is used for transporting uncompressed information between other processors and/or the shared memory controller. Information may be transferred to the processor data bus 108 from the main memory 103, either through or around the decompressor 105 via a multiplexor 111. Similarly, information may be transferred to the main memory 103 from the processor data bus 108 to the write queue 113 and then either through or around the compressor 104 via a multiplexor 112.

The main memory 103 is typically constructed of dynamic random access memory (DRAM) with access controlled by a memory controller 106. Addresses appearing on the processor address bus 107 are known as Real Addresses, and are understood and known to the programming environment. Addresses appearing on the main memory address bus 109 are known as Physical Addresses, and are used and relevant only between the memory controller and main memory DRAM. Memory Management Unit (MMU) hardware within the memory controller 106 is used to translate the real processor addresses to the virtual physical address space. This translation provides a means to allocate the physical memory in small increments for the purpose of efficiently storing and retrieving compressed and hence, variable size information.

The compressor 104 operates on a fixed size block of information, say 1024 bytes, by locating and replacing repeated byte strings within the block with a pointer to the first instance of a given string, and encoding the result according to a protocol. This process occurs through a byte-wise compare over a fixed length and is paced by a sequence counter, resulting in a constant completion time. The post process output block ranges from just a few bytes to the original block size, when the compressor could not sufficiently reduce the starting block size to warrant compressing at all. The decompressor 105 functions by reversing the compressor operation by decoding resultant compressor output block to reconstruct the original information block by inserting byte strings back into the block at the position indicated by the noted pointers. Even in the very best circumstances, the compressor is generally capable of only ¼–½ the data rate bandwidth of the surrounding system. The compression and decompression processes are naturally linear and serial too, implying quite lengthy memory access latencies through the hardware.

FIG. 2 depicts a prior art main memory partitioning scheme 200. The main memory 205 is a logical entity because it includes the processor(s) information as well as all the required data structures necessary to access the information. The logical main memory 205 is physically partitioned from the physical memory address space 206. In many cases the main memory partition 205 is smaller than the available physical memory to provide a separate region to serve as a cache with either an integral directory, or one that is implemented externally 212. It should be noted that when implemented, the cache storage may be implemented as a region 201 of the physical memory 206, a managed quantity of uncompressed sectors, or as a separate storage array 114. In any case, when implemented, the cache controller requests accesses to the main memory in a similar manner as a processor would if the cache were not present.

The logical main memory 205 is partitioned into the sector translation table 202, with the remaining memory being allocated to sector storage 203 which may contain compressed or uncompressed information, free sector pointers, or any other information as long as it is organized into sectors. The sector translation table region size 211 varies in proportion to the real address space size which is defined by a programmable register within the system. Particularly, equation 1) governs the translation of the sector translation table region size as follows:

$$\text{sector\_translation\_table\_size} = \frac{\text{real\_memory\_size}}{\text{compression\_memory\_size}} \cdot \text{translation\_table\_entry\_size} \quad 1)$$

Each entry is directly mapped 210 to a fixed address range in the processor's real address space, the request address being governed in accordance with equation 2) as follows:

$$\text{STT\_entry\_address} = \left(\left(\frac{\text{real\_address}}{\text{compression\_block\_size}}\right) \cdot \text{translation\_table\_entry\_size}\right) + \text{offset\_size} \quad 2)$$

For example, a mapping may employ a 16 byte translation table entry to relocate a 1024 byte real addressed compression block, allocated as a quantity 256 byte sectors, each located at the physical memory address indicated by a 25-bit pointer stored within the table entry. The entry also contains attribute bits 208 that indicate the number of sector pointers that are valid, size, and possibly other information. Every real address reference to the main memory causes the memory controller to reference the translation table entry 207 corresponding to the real address block containing the request address 210. For read requests, the MMU decodes the attribute bits 208, extracts the valid pointer(s) 209 and requests the memory controller to read the information located at the indicated sectors 204 from the main memory sectored region 203. Similarly, write requests result in the MMU and memory controller performing the same actions, except information is written to the main memory. However, if a write request requires more sectors than are already valid in the translation table entry, then additional sectors heed to be assigned to the table entry before the write may commence. Sectors are generally allocated from a list of unused sectors that is dynamically maintained as a stack or linked list of pointers stored in unused sectors. There are many possible variations on this translation scheme, but all involve a region of main memory mapped as a sector translation table and a region of memory mapped as sectors. Storage of these data structures in the DRAM based main memory provides the highest performance at the lowest cost, as well as ease of reverting the memory system into a typical direct mapped memory without compression and translation.

Since the compression and uncompression functions effectively encode and decode user data, any malfunction during the processes can produce seemingly correct, yet corrupted output. Further, implementing the compression/decompression hardware requires a prodigious quantity of (order 1 million) logic gates. Thus, the probability for a logic upset induced data corruption that goes undetected is significant. Special detection mechanisms within the compressor and decompressor can mitigate, but cannot provide significant fault coverage. Therefore, the need has arisen for an improved method of data management in a compressed memory system, without significant cost or complexity, to minimize the potential for a corrupted data to persist in the system without detection.

SUMMARY OF THE INVENTION

It is an object of the invention to provide a data management mechanism, within a compressed memory system, to maximize the integrity of the system operation through specific measures to guard against compression and decompression hardware induced data corruption going undetected within the system. This mechanism, sacrifices memory space (compressibility) to increase the overall reliability of the system.

It is a further object of the invention to provide a method and apparatus to compute a check code for a source data block, as the block is read in to the compressor, and append the final check code to the compressed result before storage into the compressed memory; and further, when the compressed result is read back from memory, the decompressor re-computes the check code as the decompressed data passes out of the decompressor to the requester, and compares the final computed check code with the check code appended to the received data to validate the integrity of the data block.

According to the invention, a standard 32-bit cyclic redundancy code (CRC) is computed over the uncompressed data block as it streams to the compressor. When the compression is complete and the data is to be stored in the compressed format (i.e., the data is compressible, such that a spatial advantage exists over storing the data in the uncompressed format), the CRC code is appended to the end of the compressed data block, and the associated block size is increased by the amount needed to store the code. Information that is stored in the uncompressed format, gains little benefit from the CRC as it is not encoded by the compressor, and hence is not covered by the CRC protection. Service of a memory read request, results in the decompression of a compressed block and recomputation of the standard 32-bit cyclic redundancy code (CRC) over the uncompressed data stream from the decompressor. Upon completion of the decompression of the block the appended 32-bit CRC is compared to the re-computed 32-bit CRC. When the two code are not equal, an uncorrectable error is signaled within the system to alert the operating system to the event. Uncompressed data blocks read from the memory bypass the decompressor and have no CRC associated with them.

Advantageously, such a method and system for detection of data corruption enables hardware compression to be used in enterprise class and other high reliability system applications.

BRIEF DESCRIPTION OF THE DRAWINGS

Further features, aspects and advantages of the apparatus and methods of the present invention will become better understood with regard to the following description, appended claims, and accompanying drawings where:

FIG. 4(*b*) is a state diagram illustrating the process for decompressing compressed information having the CRC according to the principals of the present invention.

DETAILED DESCRIPTION OF THE PREFERRED EMBODIMENT

Cyclic redundancy checking is a very powerful but easily implemented technique to obtain data reliability on communications links. A cyclic redundancy code (CRC) is used to protect blocks of data called frames. Using this technique, the transmitter appends an extra n-bit sequence to every frame called Frame Check Sequence (FCS). The FCS holds redundant information about the frame that helps the receiver detect errors in the frame. The receiving end applies the same polynomial to the data and compares its result with the result appended by the sender. If they agree, the data has been received successfully. If not, the data block is corrupted, and sender can be notified to resend the block of data or the. The CRC is one of the most used techniques for error detection in data communications. As described in the reference "Practical Algorithms for Programmers" by Binstock, An drew and Rex, John (Addison-Wesley 1995, pp. 564–570), the 32-bit (CRC-32) is the most common algorithm when protecting large blocks of data, however, it is understood that other coding techniques may be implemented. The 32-bit (4-byte) CRC generator polynomial, equation 3) is used to compute the CRC over the data block (X bytes) as follows:

$$CRC(X)=X^{32}+X^{26}+X^{23}+X^{22}+X^{16}+X^{12}+X^{11}+X^{10}+X^8+X^7+X^5+X^4+X^2+X+1 \quad 3)$$

Figure 1:
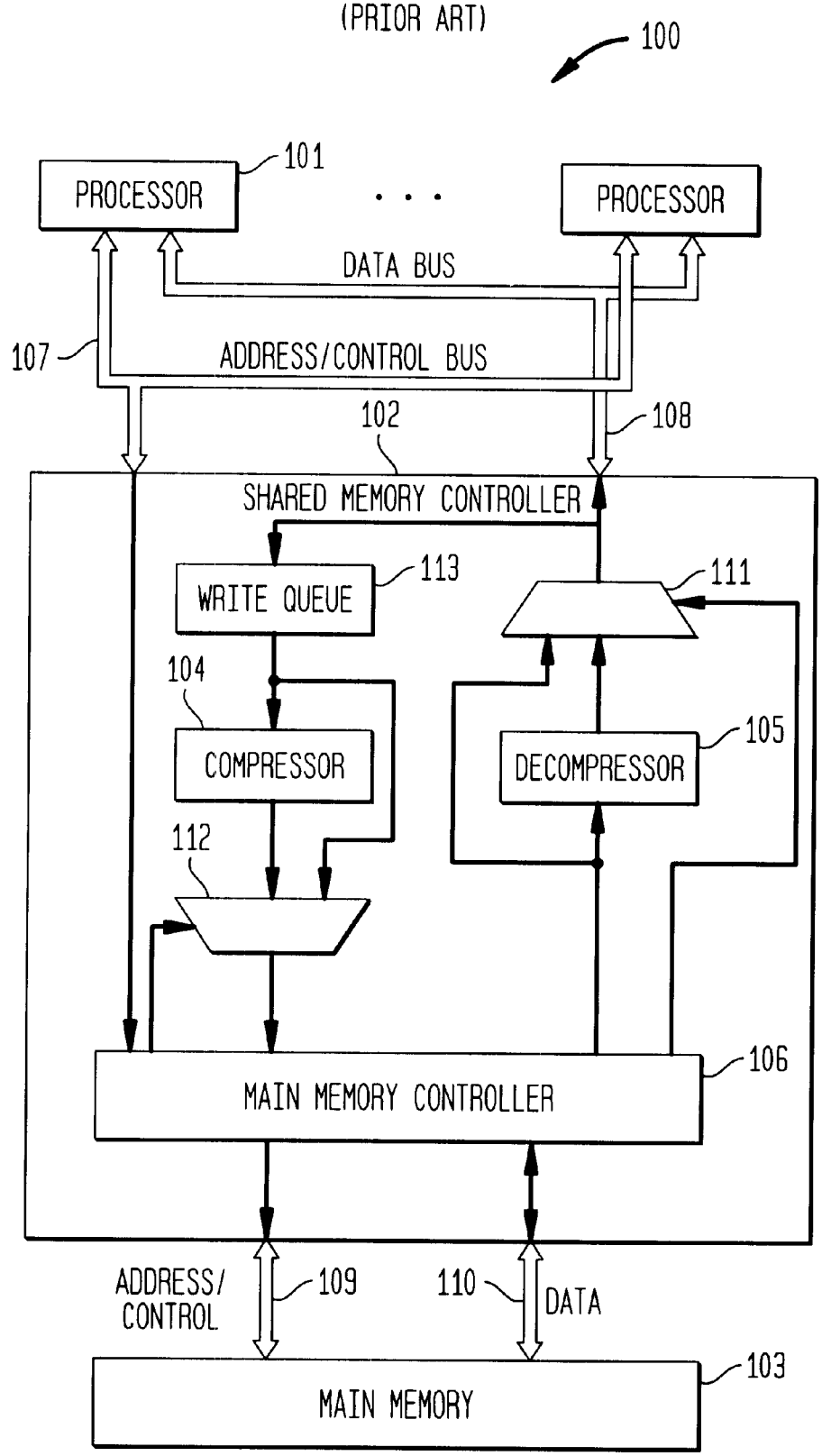
FIG. 1 illustrates a block diagram of a prior art computer having a cache and a main memory system with hardware compressor an decompressor.
Figure 2:
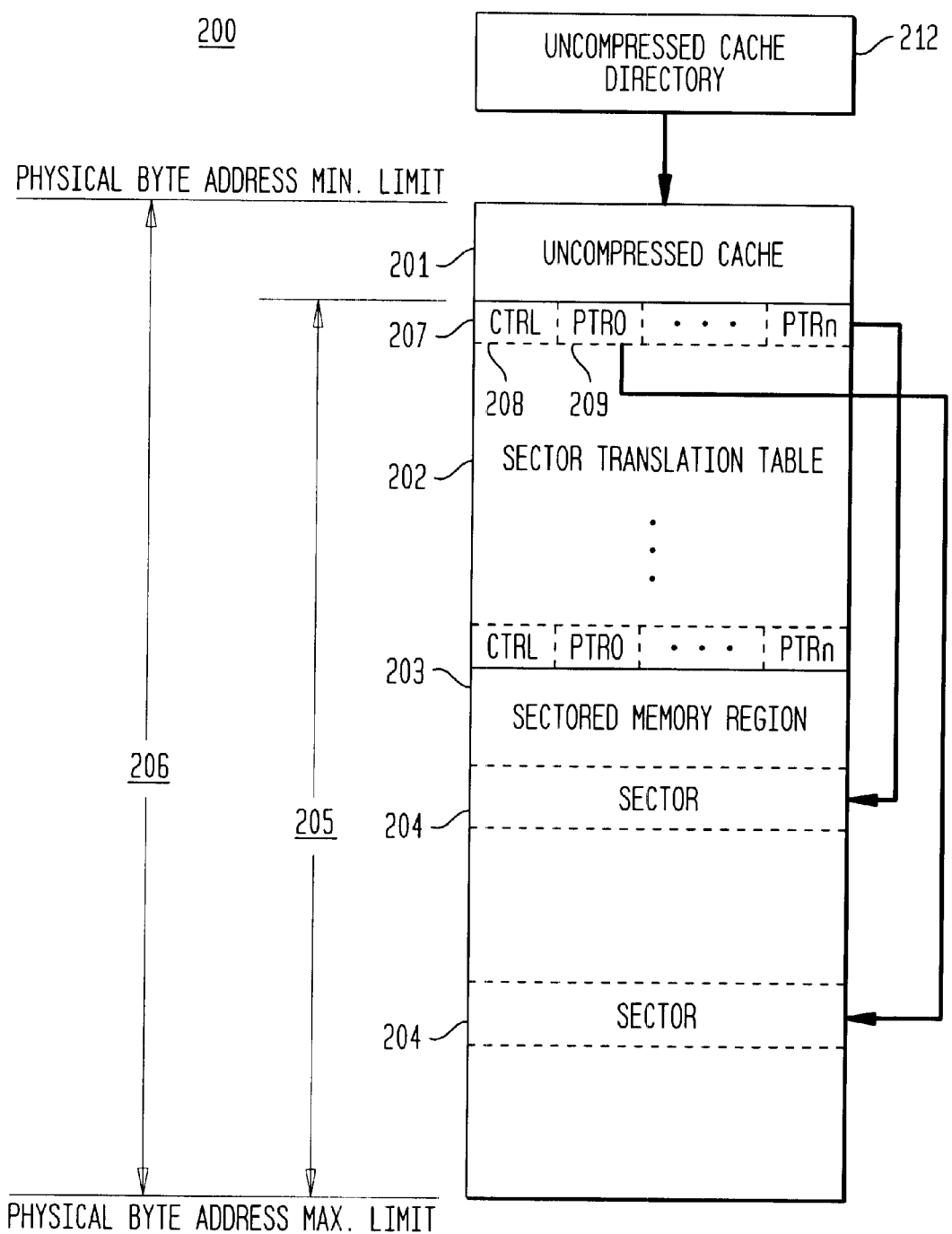
FIG. 2 illustrates prior art for a memory address space partitioning.
Figure 3:
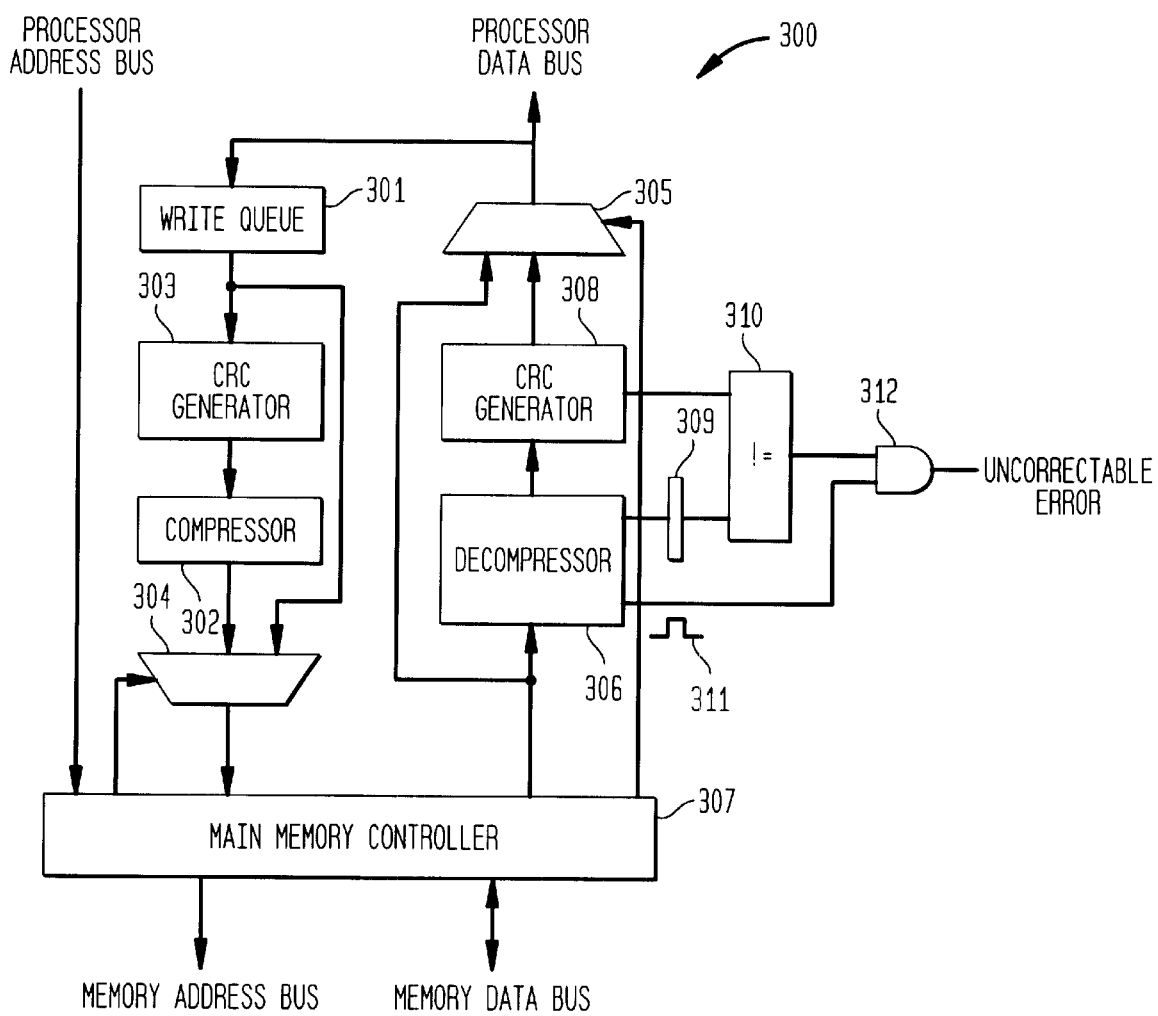
FIG. 3 illustrates the high integrity hardware memory compression apparatus according to the principals of the present invention.

FIG. 3 illustrates an improved apparatus 300 that permits compression block check codes to be calculated and used to verify the integrity of the information. A CRC-32 generator 303 is added to the memory write path between the memory write queue 301 and compressor element 302. Similarly, a CRC-32 generator 308 is added to the data read path from the decompressor element 306. During a memory write operation, the CRC generator 303 computes a CRC as data is moved through the CRC generator to the compressor 302 from the write queue 301. The compressor control logic 302 is modified to acquire the resultant 32-bit CRC following the last data transfer of uncompressed data into the compressor 303, append the 32-bit CRC to the compressor output data block, and adjust the output block size by the CRC size before forwarding the size to the memory controller 307 via multiplexor device (mux) 304. For example, a 1024 byte uncompressed data block (an atomic unit of uncompressed data) may compress to 247 bytes, resulting in a 251 byte block after the 4-byte CRC is appended to the compressed block. For cases when the data is stored in the uncompressed format (i.e., the compressibility for a given uncompressed block does not result in a spatial advantage over storing the data in the uncompressed format,) the data is written to memory directly from the write queue 301 through mux device 304 without an appended CRC. No CRC protection is employed for the uncompressed data because the data is not encoded and bypasses both the compressor 303, and decompressor 306 when later read from the memory. Therefore, no additional memory space need be reserved to store the 32-bit CRC for the uncompressed case.

As the decompressor produces uncompressed data, in support of a memory read operation of compressed data from the main memory controller 307, it is passed through the CRC generator 308 to the output multiplexor device (mux) 305. The CRC generator 308 computes the CRC in the same manner as the CRC generator 303, to insure that both circuits generate the same resultant CRC, given the same uncompressed input data. The decompressor 306 is modified to expect and remove the 32-bit CRC off the compressed data block, and store the removed CRC value in a register 309. Subsequently, via a comparator device 310, the removed CRC value is compared to the 32-bit CRC value generated by the CRC generator 308. Specifically, the decompressor 306 asserts a strobe 311 at such time that the final CRC value is valid, from the CRC generator 308, so that the output of the logical "AND" 312 may signal an uncorrectable error, should the two CRC values not be equal. This condition is used to signal the system that the information associated with the memory read request is corrupted.

Figure 4A:
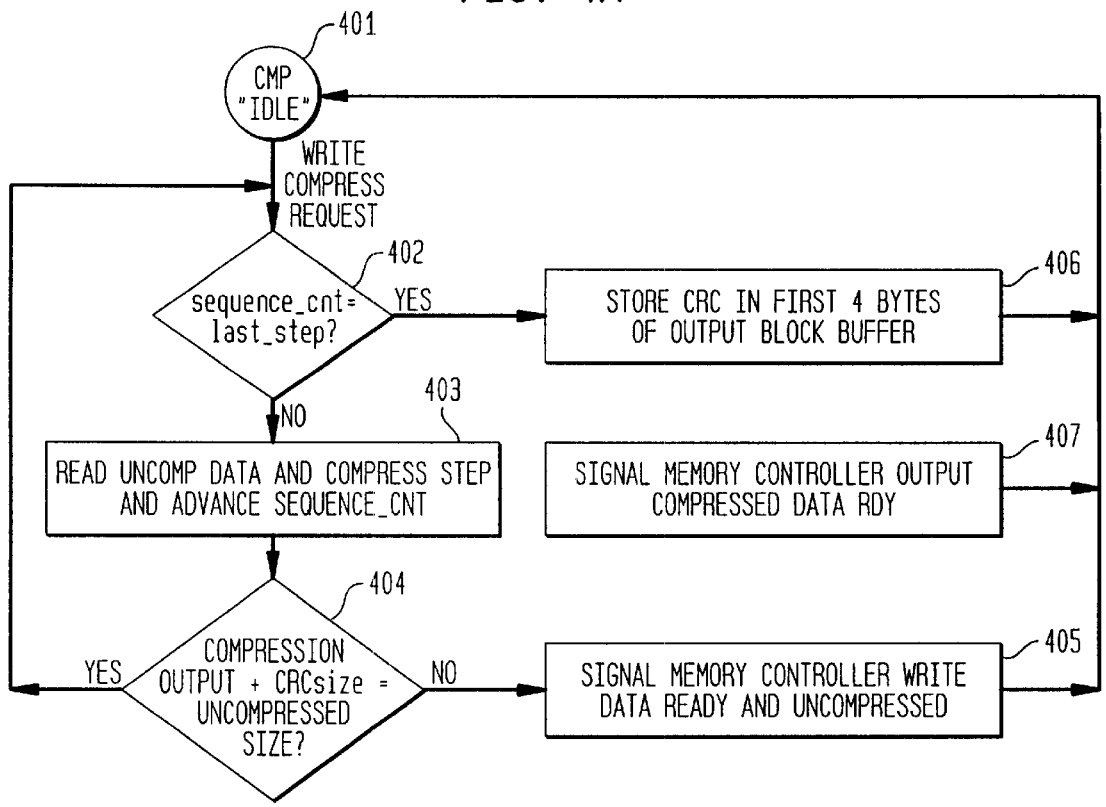
FIG. 4(*a*) is a state diagram illustrating the process for compressing a fixed block of uncompressed information into an encoded output block according to the principals of the present invention.
Figure 4B:
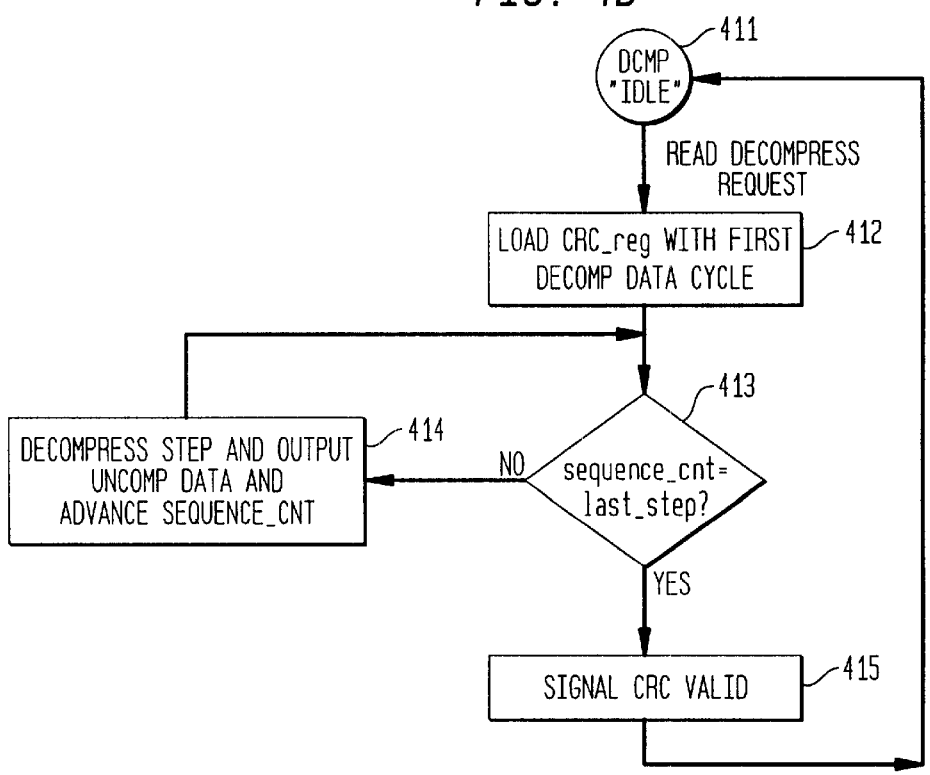

Referring now to FIGS. 4(a) and 4(b), there is illustrated respective state diagrams 401 and 411 for the independent processes that cooperate, using the aforementioned apparatus 300 (FIG. 3), for the purpose of compressing and decompressing main memory information with check code protection. FIG. 4(a) illustrates the process for compressing a fixed block of uncompressed information into an encoded output block of variable size, and including a check code computed over the entire uncompressed block, and appended to the final encoded output block for storage to the main memory. FIG. 4(b) illustrates the process for decompressing a variable size encoded data block, with an appended check code, upon retrieval from the main memory.

With reference to FIG. 4(a), the compression process 400 is shown including a new step 406 and a modified step 404, for handling a check code for protection of the compressed block. The process entails incrementally constructing an encoded output data structure in an output buffer contained within the compressor element. Space is reserved in the buffer for the fixed size check code (CRC-32). The check code space may be reserved at the end of the compressed output block, or, preferably, at the beginning of the compressed output buffer. The process commences 401 with a memory write request from the system when the write queue 301 (FIG. 3) has accumulated the uncompressed information needed to start the compression. At step 402, a compression sequence counter is compared to the "last step" fixed constant value, to determine if the compression sequence concluded normally. If the compression sequence counter equals the "last step" fixed constant value, then at step 406, the final check code is stored in the first four bytes reserved at the beginning of the output buffer. Then at step 407, the memory controller is signaled that the compressed data is ready to be stored in the main memory, before the process returns to the idle state. The memory controller is responsible to allocate the appropriate amount of storage, as indicated by the compressor, for the variable size compressed data.

Referring back to step 402, if the compression has not reached the last incremental step, then the process proceeds to step 403 where the sequence counter is advanced. Then at step 404, a comparison is made between the accumulated output block size (including the check code size) and the fixed uncompressed block size (1024 bytes, in this example). If the compressed accumulated output block size (including the check code size) is not smaller than the fixed uncompressed block size, then the compression is aborted and the memory controller is signaled to store the uncompressed data (from the write buffer) to the memory at step 405, before returning to the "idle" state. Otherwise, if the compressed accumulated output block size (including the check code size) is smaller than the fixed uncompressed block size, then the next iteration of the compression process commences at step 402.

With reference to FIG. 4(b), the decompression process is shown including new steps 412 and 415 for handling a check code for protection of the compressed block. The process entails incrementally expanding the encoded compressed data block from an input buffer, filled by the memory controller and contained within the decompressor. The process 411 commences with the memory controller indicating a read decompress request, after it places enough data in the decompressor input buffer and in response to the read request from the processor or uncompressed cache control. At step 412, the check code (CRC-32) is read from the first four bytes of the buffer and written to the special holding register 309 (FIG. 3) for later comparison to the post decompress check code. Then, the process loops incrementally through steps 413 and 414, decompressing the input data and yielding a fixed quantity of data each iteration, until the sequence counter is equal to the last step. Then, once the sequence counter is equal to the last step at step 415, a strobe signal 311 (FIG. 3) is asserted to indicate that the last transfer of decompressed data is ready within the CRC generator 308, and the check code compare 310 is valid through logic gate 312. The decompression is complete and control returns to the idle state.

The preferred embodiment results in a system shutdown upon detection of a CRC miscompare condition. However, applications may use the condition to signal that the memory read operation be re-executed, as the CRC miscompare could have been caused by a transient logic upset during the decompression, and therefore may not result in a CRC miscompare on a subsequent attempt. Further, the check coding scheme need not follow the CRC-32 algorithm, as shown in the preferred embodiment. However, the check coding scheme needs to be computed over the entire uncompressed block, preferably, at a point in the data path closest to the last data integrity check (e.g., error correction coding, parity), but before the data is encoded through the process of compression. The check code should be as small as possible, but still able to provide suitable immunity to multiple bit errors, as the check code represents a loss of compression ratio when it is stored into the main memory.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

Having thus described our invention, what we claim as new, and desire to secure by Letters Patent is:

1. A computer memory system implementing a processing device for enabling indirect storage and retrieval of compressed data in a physical memory associated with a computing system and issuing real memory addresses for accessing said data from said physical memory, comprising:

first redundant protection code generator device for receiving uncompressed data from said processor device and generating a redundant protection code associated with said uncompressed data during a compression operation;

a compressor mechanism for receiving said uncompressed data from said first redundant protection code generator and generating a compressor encoded output data for storage in said physical memory with its associated redundant protection code;

a decompressor mechanism for receiving said compressor encoded output data from said memory and decompressing said data information into an uncompressed form during a decompression operation;

a second redundant protection code generator device for receiving said data in uncompressed data form from said decompressor mechanism and recomputing said redundant protection code from said uncompressed data during said decompression operation; and a comparator device for comparing a redundant protection code value associated with said uncompressed data during said compression operation and said recomputed redundant protection code value obtained during said decompression operation, said system flagging a data corruption occurrence when said redundant protection code values differ.

2. The computer memory system as claimed in claim 1, wherein each said first and second redundant protection code generators comprises a cyclic redundancy code generator device for generating a cyclic redundancy code for an atomic unit of uncompressed information operated on.

3. The computer memory system as claimed in claim 1, wherein said redundant protection code is appended to said compressed encoded output data for storage in said physical memory as an aggregated data unit.

4. The computer memory system as claimed in claim 3, wherein said compressor includes an output block for receiving said encoded output data, said compressor mechanism includes mechanism for adjusting an output block size to accommodate appendage of said redundant protection code.

5. The computer memory system as claimed in claim 3, wherein said decompressor includes an extractor device for extracting said appended redundant protection code from said physical memory stored prior to decompression operation for its associated compressed encoded output data.

6. The computer memory system as claimed in claim 5, further including register device for temporarily holding said extracted redundant protection code until a subsequent comparison operation with the recomputed redundant protection code is performed.

7. The computer memory system as claimed in claim 6, wherein said decompressor includes timing mechanism for generating a strobe when a last uncompressed data is ready within said second redundant protection code generator, for the purpose defining when said redundant protection code comparison is valid.

8. A method for providing data integrity in a computer memory system implementing compressed memory storage, said method comprising the steps of:

a) generating an original data protection code value associated with a unit of uncompressed data to be written in compressed form to a physical memory during a compression operation;

b) aggregating said original data protection code with a compressor encoded output data for storage in said physical memory as an aggregated data unit;

c) upon reading said compressed data from said memory, retrieving said original data protection code during a decompression operation;

d) recomputing said original data protection code value associated with resultant uncompressed data obtained output from a decompressor during a decompression operation;

e) comparing said original data protection code value with said recomputed data protection code; and, f) generating a system error signal when said data protection code values differ.

9. The method as claimed in claim 8, wherein said aggregating step b) includes the step of concatenating said original data protection code with a block of data comprising said compressor encoded output data to form said aggregated data unit.

10. The method as claimed in claim 8, wherein said aggregating step b) further includes the step of adjusting a block size in said memory for accommodating extra bytes in said aggregated compressor encoded output data.

11. The method as claimed in claim 8, wherein said retrieving step c) further includes the steps of:
   extracting said original data protection code from said aggregated data unit; and,
   storing said retrieved original data protection code until such time said comparing step is performed.

12. The method as claimed in claim 8, wherein said generating step a) includes the step of:
   incrementally reading uncompressed data from a write queue associated with said computer memory system;
   in each increment, comparing a total of said compressor encoded output data and said original data protection code value against a size of said uncompressed data; and,
   signaling a memory controller device associated with said computer memory system to store said compressor encoded output data and said original data protection code value when said total is less than said uncompressed data size.

13. The method as claimed in claim 12, further including the step of bypassing said compression operation when said total of said compressor encoded output data and said original data protection code value is greater than said uncompressed data size.

14. An compressed data integrity verifier for a computer memory system having a first data path implementing a compressor device for writing compressed encoded output data to a physical memory in a compression operation, and a second data path implementing a decompressor device for retrieving said compressed encoded output data from said physical memory and generating a resultant uncompressed data output for use by a computing system during a decompression operation, said verifier comprising:
   a) a cyclic redundancy code (CRC) generator device in said first data path for generating an original CRC data associated with a unit of uncompressed data to be compressed;
   b) device for aggregating said original CRC data with its associated compressed encoded output data for storage in said physical memory as an aggregated data unit;
   c) extractor device for retrieving said original CRC data from said stored aggregated data unit during a read request for said uncompressed data unit, and temporarily storing said original CRC data during said decompression operation;
   d) a cyclic redundancy code (CRC) generator device in said second data path for receiving said resultant uncompressed data and recomputing a CRC data value; and,
   e) comparator device for comparing said original CRC value with said recomputed CRC value and generating a system error signal when said original CRC and recomputed CRC values differ.

15. The compressed data integrity verifier as claimed in claim 14, further including means for ensuring that a spatial advantage exists for storing said compressed data output from a compressor device and its associated original CRC over storing the data in the uncompressed format.

16. The compressed data integrity verifier as claimed in claim 15, further including register device for holding said extracted original CRC until a subsequent comparison operation with the recomputed CRC is performed.

17. The compressed data integrity verifier as claimed in claim 16, wherein said decompressor device includes a timing mechanism for generating a strobe at a point in time when said resultant uncompressed data has been processed by said CRC generator device in said second data path to enable a valid CRC comparison operation.

* * * * *